United States Patent [19]
Buffet et al.

[11] Patent Number: 4,972,244
[45] Date of Patent: Nov. 20, 1990

[54] PHOTODIODE AND PHOTODIODE ARRAY ON A II-VI MATERIAL AND PROCESSES FOR THE PRODUCTION THEREOF

[75] Inventors: Jean-Louis O. Buffet, Sevrier; Jean-Yves Laurent, Claix; Jean-Luc Rochas, Eybens, all of France

[73] Assignee: Commissariat a l'Energie Atomique, Paris, France

[21] Appl. No.: 362,605

[22] Filed: Jun. 7, 1989

[30] Foreign Application Priority Data

Jun. 16, 1988 [FR] France ................. 88 08074

[51] Int. Cl.$^5$ ............... H01L 27/14; H01L 31/00
[52] U.S. Cl. ........................... 357/30; 357/32; 357/20; 357/61
[58] Field of Search ........... 357/65, 32, 30 H, 30 B, 357/30 D, 55, 31, 30 R, 61, 20; 250/370.13, 332, 221 J, 211 R

[56] References Cited

U.S. PATENT DOCUMENTS

| | | | |
|---|---|---|---|
| 3,878,553 | 2/1975 | Sirles et al. | 357/56 |
| 4,206,003 | 6/1980 | Koehler | 148/1.5 |
| 4,290,844 | 9/1981 | Rotolante et al. | 156/630 |
| 4,494,133 | 1/1985 | Dean et al. | 357/30 |
| 4,524,378 | 6/1985 | Cockrum et al. | 357/71 |
| 4,639,756 | 1/1987 | Rosebeck et al. | 357/30 |
| 4,646,120 | 2/1987 | Hacskaylo | 357/30 |
| 4,695,861 | 9/1987 | Paine et al. | 357/30 |

FOREIGN PATENT DOCUMENTS

| | | |
|---|---|---|
| 0262030 | 3/1988 | European Pat. Off. . |
| 58-54671 | 3/1983 | Japan ........... 357/30 |
| 87/07083 | 11/1987 | PCT Int'l Appl. . |

Primary Examiner—Andrew J. James
Assistant Examiner—Donald L. Monin, Jr.
Attorney, Agent, or Firm—Pearne, Gordon, McCoy & Granger

[57] ABSTRACT

Photodiode and array of photodiodes on II-VI material and their production processes. The photodiodes (48) are formed in a type P, $Hg_{1-x}Cd_xTe$ semiconductor layer (13) with $0 \leq x \leq 1$ deposited directly on a CdTe insulating substrate (11), having an active zone (37) of type N, a first electrical contact (47) on the semiconductor layer, a second electrical contact (45) on the active zone, and insulant (21) separating the first and second electrical contacts and an insulation or isolation trench (15), whose depth exceeds the thickness of the active zone and surrounding the latter, the first electrical contact (47) being located in the bottom (27) of the trench.

9 Claims, 4 Drawing Sheets

PHOTODIODE AND PHOTODIODE ARRAY ON A II-VI MATERIAL AND PROCESSES FOR THE PRODUCTION THEREOF

DESCRIPTION

The invention relates to a photodiode and to an array of photodiodes of the photovoltaic type made from a II-IV semiconductor material, manly used for the detection of infrared radiation.

The semiconductor compound is a solid solution of mercury telluride, cadmium telluride and/or zinc telluride of general formula $Hg_{1-x-y}Dc_xZn_yTe$. Parameters x and y which pass separately from 0 to 1, are commonly called the composition. They fix the respective quantities of HgTe, CdTe and ZnTe, as well as the forbidden band width of the compound. In turn, the latter fixes the spectral detection range of the radiation.

The compositions x and y can be continuously adjusted, thus making it possible to cover a vast spectral range from 800 nm (x=1) to very great wavelengths and detections up to a wavelength of 300 micrometers have been demonstrated.

An increasing interest has been attached to spectral ranges adapted to atmospheric transmission windows, e.g. windows having a wavelength of 3 to 5 micrometers (x=0.3) and 8 to 12 micrometers (x=0.2). Thus, these transmission windows are very suitable for thermal imaging.

The compound HgCdTe has universally been used for producing detectors equipping high performance infrared systems. This material makes it possible to produce mosaics and in particular arrays of photovoltaic detectors of high quality with integrated electronic reading, whilst still ensuring an optimum coupling with the reading circuit and a very low dissipation.

The most important parameters which must be satisfied by a photovoltaic photodiode appearing in the enclosed FIG. 1 showing the characteristic I=f (V) of such a photodiode are a short-circuit current or photocurrent $I_{cc}$ which is a function of the flux of instant photons, the quantum efficiency and the sensitive surface of the diode, a dynamic resistance $R_o$ with zero polarization and a high avalanche voltage $V_A$.

In many applications, photodiodes operate at zero polarization. They must therefore have high dynamic resistance $R_o$ and a high quantum efficiency in order to ensure a high detectivity. Thus, the value of the resistance which is initially $R_o$ and that of the quantum efficiency are high dependent on the photodiode structure. In addition, the attached FIG. 2 shows a HgCdTe photodiode having a planar structure and of a known type.

This photodiode generally comprises, on a CdTe monocrystalline insulating or isolating substrate 1, a type P $Hg_{1-x}Cd_xTe$ monocrystalline semiconductor layer 3 with $0 \leq X \leq 1$. The monocrystalline layer 3 has a type N (or N+) region 5 constituting the active zone of the photodiode. It is surmounted by a generally ZnS insulating or isolating material 7 having a window 9 ensuring electrical contacting with the type N region 5. This contacting is ensured by a pad 11, which is generally of a chromium and gold ally. Such a photodiode is described in "Semiconductor and Semimetals", vol. 18, Mercury cadmium telluride, chapter 6, Academic Press.

When illuminating the rear face of the photodioide, i.e. Illuminating by the substrate, 1 as shown in FIG. 1, most of the current passing through the PN junction (type P layer 3 and the N zone 5) comes from the electrons produced by the radiation and in the P region and then the collection efficiency of these electrons in said region via the diffusion length Ln of the said diffusion length of the electrons Ln is dependent on the doping level of the P region, or more precisely said diffusion length Ln increases when the doping level of the P region decreases. It can in particular exceed the thickness of the semiconductor layer 3.

When the photodiodes are produced on HgCdTe deposited on a CdTe insulating substrate, it is possible to obtain performances of $R_o$ better than those obtained on a solid material. For this purpose, the thickness Xp of the P region must in all directions be much less than the diffusion length Ln in said same region. These considerations apply for as long as the recombination speed at the substrate-semiconductor layer and semiconductor layer-insulent 7 interfaces remains low, which corresponds to good quality interfaces their contribution to the resistance $R_o$ results from diffusion mechanisms. Thus, $R_o$ varies with the operating temperature of the photodiodes.

However, this does not reduce the contribution of the lateral surface $A_l$ of the junction to the resistance $R_o$. $R_o$ has two components in parallel $R_{of}$ and $R_{ol}$ satisfying the equation $1/R_o = 1/R_{of} + 1/R_{ol}$ with $R_{of}$ the fraction of $R_o$ attributed to the bottom of the junction and $R_{ol}$ the fraction of $R_o$ attributed to the lateral surface $A_l$ of the PN junction.

Thus, these components are on the one hand inversely proportional to the surface taken up by them and on the other hand are directly proportional to the value of the ratio Ln/Xp, in which Xp is the thickness of the P region in the considered direction.

Thus, these expressions show the contribution of the lateral component to the value of $R_o$. For example, in the case of $20 \times 20$ $\mu m^2$ photodiode and with a N region depth of 2.5 $\mu m$, the total surface of the photodiode is 400 $\mu m^2$, whilst its lateral surface is 200 $\mu m^2$. In the case of the drawing with Ln>2Xp obtained by a reduction of the thickness of layer 3 (Xp being considered in the vertical direction of the photodiode), the increase of $R_o$, experimentally determined by the inventors, does not exceed 20 to 30% of the value of $R_o$ which would have occurred for Ln$\leq$Xp, whereas an improvement by a factor of 2 could have been expected. Thus, it is not possible to expect a significant increase in the detectivity of the photodiode by merely reducing the thickness Xp in the vertical direction of the semiconductor layer 3.

Moreover, in order to ensure a great homogeneity of the photocurrent $I_{cc}$, as well as a better quantum efficiency, it is necessary to adjust Xp-Ln. Thus, the thickness of the semiconductor layer 3 can vary by $\pm 2$ $\mu m$, which corresponds to normal dispersions for an epitaxy on CdTe. One way of overcoming these thickness fluctuations consists of increasing the diffusion length Ln or and this amounts to the same thing reducing the doping of the P region.

In addition, great interest is attached to producing photodiodes having a diffusion length Ln of the electrons produced in the P region greater than the thickness Xp of said same region, in all directions in space, both from the standpoint of $R_o$, as well as that of the quantum efficiency and the photocurrent dispersions.

The invention also relates to a photodiode having improved performance characteristics compared with the prior art photodiodes.

Moreover, within the framework of producing mosaics of photodiodes with infrared detection systems, it is desirable to produce these mosaics in the form of arrays with a high integration density.

The invention therefore relates to a photodiode on a semiconductor II-VI material having improved $R_o$ performance characteristics and a high integration density.

The invention therefore relates to a photodiode formed in a II-VI material semiconductor layer of a first conductivity type directly deposited on an insulating substrate, having an active zone of a second conductivity type differing from the first, a first electrical contact on the semiconductor layer, a second electrical contact on the active zone, an insulant separating the first and second electrical contacts, an insulation trench formed in the semiconductor layer and surrounding the active zone having a depth greater than the thickness of the active zone, but less than the thickness of the semiconductor layer, the first electrical contact being located in the bottom of the trench.

This photodiode can be used either in illuminating by the rear face (substrate face) or in illuminating by the front face (face opposite to the substrate).

The use of an isolation or insulation trench with a depth greater than the thickness of the active zone makes it possible to increase $R_{ol}$ and consequently $R_o$ by reducing the thickness Xp laterally.

The semiconductor layer can be constituted by a binary material (e.g. CdTe), a ternary material (e.g. HgCdTe, HgZnTe) or a quaternary material (e.g. of type HgZCdTe). In general terms, the II-VI material is of formula $Hg_{1-x-y}Cd_xZn_yTe$ with $0 \leq x \leq 1$ and $0 \leq y \leq 1$.

The invention also relates to an array of photodiodes having photodiodes of the type described hereinbefore, the first electrical contacts of said photodiodes all being electrically interconnected.

In the article by J. F. Kim et al. "Crosstalk Measurements on a Linear Area of Deep U-Grooves Isolated Silicon Photodiodes", Optical Engineering, September–October 1983, vol. 22, no. 5, pp 665–659, it is know to electrically reciprocally isolate or insulate photodiodes produced on a solid silicon with the aid of insulation trenches with a view to minimizing the detection of spurious radiation. These trenches are only produced in a single direction of the detection surface. In this article, the photodiodes consist of an isolated P region, a common median N region an a common P substrate. The contracting on the N regions, which are electrically interconnected, takes place on one of the lateral faces of the photodiode array.

It is also know from WO-A No. 87/07083 and US-A- No. 4 646 120 to produce insulation trenches around active zones of photodiodes of a photodiode array. In the above specifications, use is made of three superimposed semiconductor layers in order to produce a peripheral electrical contact common to all the P zones of the photodiodes.

It is known that the P type contact of te photodiodes must be realized in a high doped region, whereas the obtaining of a high performance detector requires the use of a slightly doped P region. Therefore the above specifications use a highly doped P-type layer supporting a less doped P-type layer and then a N-type layer in order to produce the PN junction.

According to the invention, producing the electrical contact of the semiconductor layer in the bottom of trenches, apart from the advantages given hereinbefore, makes it possible to increase the integration density of the photodiodes in the case of a mosaic of photodiodes.

Thus, contacting on the semiconductor layer and on the active zone effected on the surface of each photodiode or on the front face, as described in FR-A- No. 2 604 298 filed in the name of the present Applicant, makes it necessary to retain an adequate guard between the contact in order to prevent short-circuiting. Moreover, this solution leads to a reduction of the sensitive surface of the photodiodes and therefore to a reduction in the short-circuit current the detectivity of the photodiodes.

The first type of conductivity can be of the P or N type and conversely the second type of conductivity of the N or P type. The materials which can be used for producing the first and second electrical contacts mainly depend on the type of doping of the semiconductor layer. For a P doping, the electrical contacts are made from gold, copper of a two-layer chromium - gold material, whilst for a N doping, the said contacts are generally of aluminium.

According to the invention, the improvement to the $R_o$ performance characteristics increases in proportion to the deepness of the trenches and are in particular 2 to 3 times greater than the thickness of the active zone, whilst the access resistance to the photodiode also increases. Moreover, the production of the first electrical contact at the bottom of the trench makes it possible to reduce the said access resistance.

The invention also relates to a process for producing a photodiode comprising:

(a) making a trench in a II-VI material semiconductor layer of a first conductivity type, directly deposited on an insulating substrate, thus insulating a semiconductor zone, the trench having a depth less than the thickness of the semiconductor layer, (b) depositing an insulating material on the complete structure, (c) making a first opening of the insulating layer in the bottom of the trench, (d) filling the trench with a protective material, (e) implanting ions of a second conductivity type in the semiconductor zone, the thickness of the implanted zone being less than the depth of the trench, (f) making a second opening of the insulating material facing the implanted zone, (g) eliminating the protective material, (h) making first and a second electrical contacts respectively in the bottom of the trench and facing the implanted zone.

This process has the advantage of being much simpler than the prior art processes, whilst ensuring improved $R_o$ performance characteristics and a higher integration density than in the prior art.

In order to obtain deep trenches, whose sides are as vertical as possible, use is either made of an anisotropic, planar etching process after having produced a mask mainly of photosensitive resin of the surface of the semiconductor defining the location, width and length of the trenches, or by using ionic working.

Preference is given to the use of ionic working or machining, the ions used being mainly ions of rare gases, such as of argon, Kryton or xenon.

Advantageously the trenches are more deep than wide, which makes it possible to prevent the deposition of metal on the walls of said trenches when making the contacts on the substrate. In particular, the trenches have a depth 2 to 3 times greater than their width.

In order to fix the doping level of the semiconductor layer of the first conductivity type and consequently the diffusion length of the carriers in said layer (electrons for a P-type material and holes for a N-type material) and simultaneously restore defects introduced into said layer during ionic working, a thermal annealing of the structure takes place at between 200° and 300° C. Such a heat treatment is more particularly described in FR-A- No. 2 604 298. In the case of a P-type material, this heat treatment makes it possible to bring the regions of the N type induced by ionic bombardment to a conductivity of the P type.

With a view to overdoping, in accordance with the present invention, the semiconductor layer of the first conductivity type beneath the isolation trenches, at the bottom of said trenches is deposited a metallic layer containing doping ions of the same conductivity type as the semiconductor layer, said deposition taking place just prior to filling the trenches with the protective material. This overdoping makes it possible to reduce the access resistance of the contact and in particular to give same an ohmic character.

the metallic layer containing the doping ions also makes it possible to prevent the exodiffusion of the constituents of the semiconductor layer, such as mercury, during the heat treatment.

Instead of using a metallic layer at the bottom of the trenches, it is possible to prevent the exodiffusion or mercury during the heat treatment, by in known manner carrying out said treatment under a mercury atmosphere in a sealed envelope.

The insulant used for electrically insulating the two electrical contacts of each photodiode can be in the form of a single insulating layer, e.g. of SiO, $SiO_2$, ZnS, CdTe or $Si_3N_4$, or a double insulating layer in order to ensure the best possible interface between the semiconductor material and the electrical contacts, as well as the optimum insulating properties of the material. The insulating material has a thickness between 100 and 1000 nm.

Preferably, the insulating material is deposited by radiofrequency cathodic sputtering, because this makes it possible to obtain a good quality insulant. However, according to this procedure, it was not possible to cover the bottom and sides of the trenches, because the latter have a depth exceeding their width (preferably 2 to 3 times greater). In order to increase the insulant coverage level, it is possible to polarize the conductive support carrying the photodiodes during the sputtering of the insulant, said support being connected to a continuous or radiofrequency generator. This know polarization process is called BIAS.

Other features and advantages of the invention can be gathered from the following illustrative and non-limitative description with respect to the drawings.

BRIEF DESCRIPTION OF DRAWINGS

As shown in FIG. 3, the first stage of the process consists of directly depositing on a monocrystalline insulating substrate 11, which is transparent to infrared radiation, a monocrystalline semiconductor layer 13. Substrate 11 is either of sapphire or the CdTe. The $Hg_{1-x}Cd_xTe$ semiconductor layer 13, with x ranging between 0 and 1 and in particular between 0.2 and 0.3, can be epitaxied by mercury plasma cathodic sputtering or liquid phase epitaxy (LPE). This type P layer 13 has a thickness between 6 and 10 $\mu$m.

According to the invention, ionic working or machining of the semiconductor layer 13 takes a view to forming trenches 15 in the two direction x and y contained in the plane of layer 13. These trenches 15 are formed in such a way that beneath the said trenches is left the semiconductor material of layer 13. In other words, the depth h of these trenches is less than the thickness of layer 13. Trenches 15 have a depth h of 3 to 8 $\mu$m, a width l of 2 to 5 $\mu$m and a length L between 5 and 50 $\mu$m.

These trenches define semiconductor zones 17 of length L and width l, which are insulated from one another. Ionic working can be carried out with an ionic current of 500 $nA/cm^2$ and an energy of 500 eV leading to a HgCdTe etching speed close to 200 nm/min. These performances are obtained with the device marketed under the name "Microetch" Veeco Instruments. By proceeding in this way, the etching gradient is very considerably and exceeds 80°. In other words, the sides 19 of the trenches are virtually vertical.

This etching stage is optionally followed by a first heat treatment at between 200° and 300° C., in order to fix the type P doping level in layer 13 and therefore the diffusion length Ln of the electrons in said layer. This heat treatment also ensures the regeneration of the zones of layer 13 in the vicinity of and in contact with trenches 15.

Figure 2:
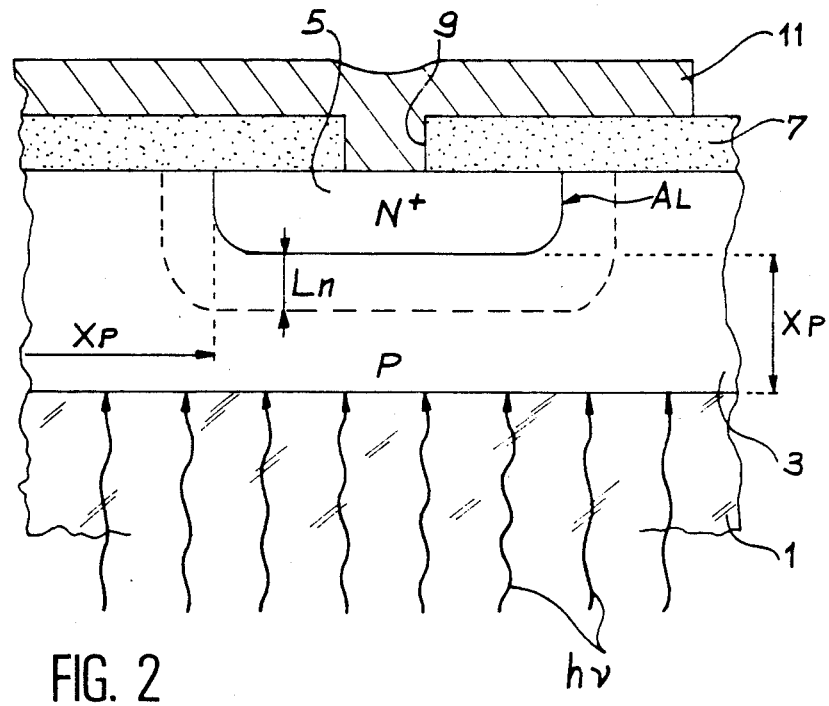
FIG. 2 Already described, diagrammatically a HgCdTe photovoltaic photodiode with a planar structure illustrating the prior art.
Figure 1:
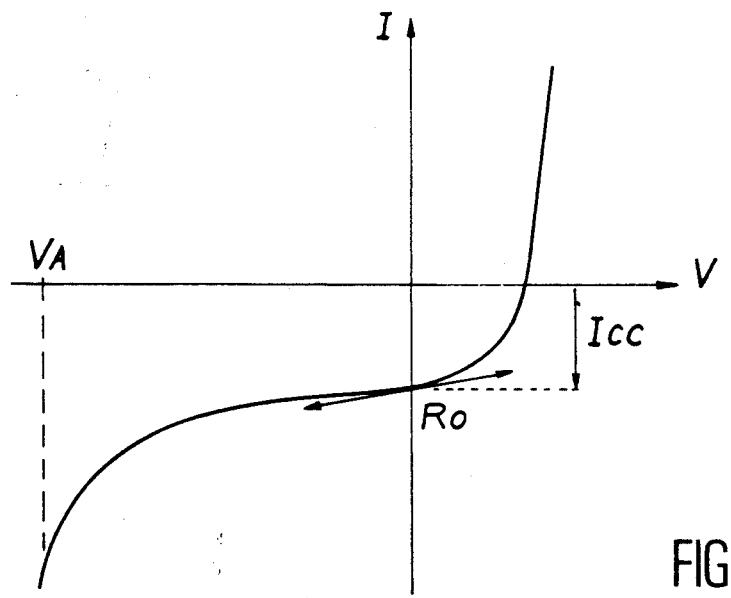
FIG. 1 Already described, a graph giving the variations of the current I as a function of the voltage V applied to the terminals of a prior art HgCdTe photovoltaic photodiode.
Figure 3:
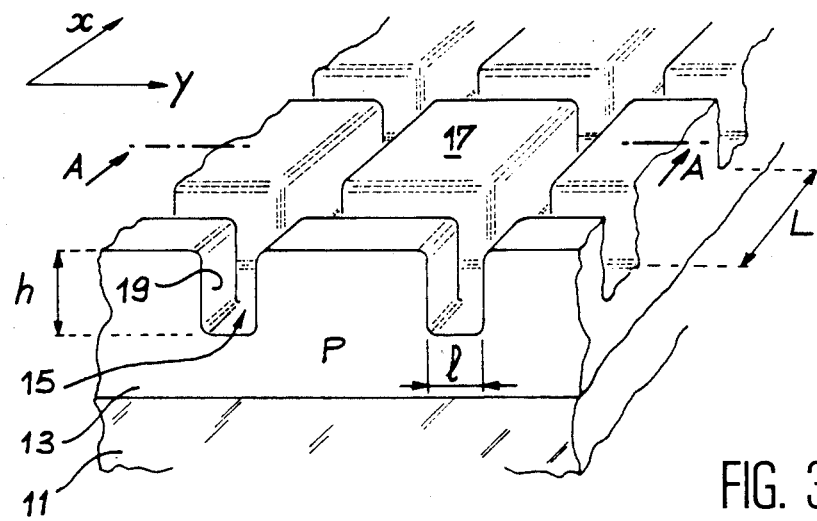
FIGS. 3 to 11 Diagrammatically the different stages of the process producing a mosaic of photodiodes according to the invention, FIG. 3 and 10 being perspective views and FIGS. 4 to 9 and 11 sectional views along plane A—A of FIG. 3.
Figure 4:
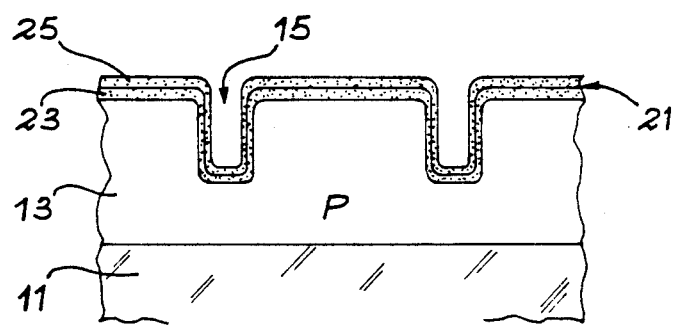

As shown in FIG. 4, this is followed by the deposition of radiofrequency cathodic sputtering of an insulating material 21 advantageously formed from a first CdTe layer 23 covered by a second ZnS layer 25. The use of the CdTe layer 23 improves the quality of the interface of the insulant as a result of its chemical and crystallographic compatibilities with the semiconductor material of layer 13. The thickness of material 21 is approximately 500 nm. Deposit 21 is advantageously carried out by polarizing the not shown conductive support supporting the substrate 11 with the continuous or RF generator.

Figure 5:
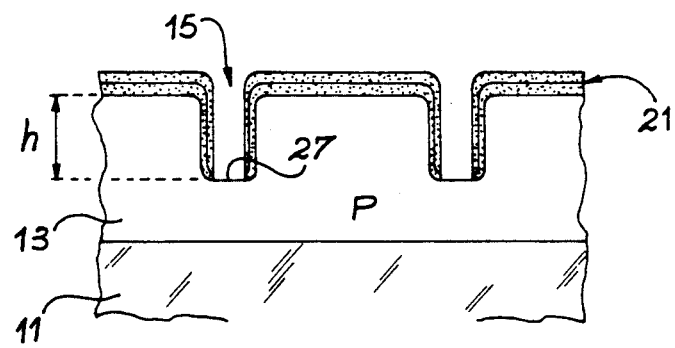

The following stage of the process illustrated in FIG. 5 consists of freeing by self-alignment the bottom 27 of trenches 15, more particularly by using ionic working with $Ar^+$ ions. Due to the fact that the depth of the trenches is at least twice greater than their width, the thickness of the insulating material 21 is at least twice smaller a the bottom of the trenches than on the surface of the semiconductor layer 13. Thus, ionic working only exposes the bottom 27 of the trenches.

Figure 6:
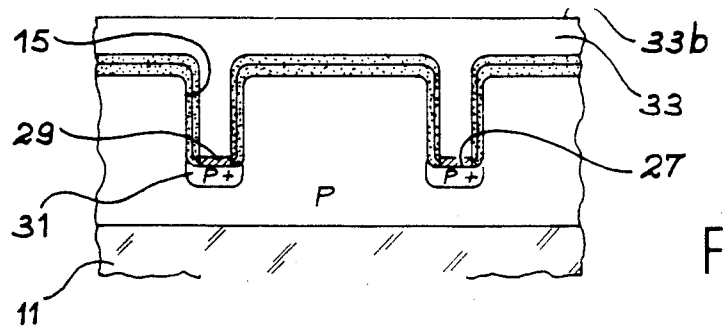

As shown in FIG. 6, this is advantageously followed by the deposition of a metallic layer 29 in the bottom 27 of each trench containing P-type doping ions. This metallic layer 29 has a thickness of between 10 and 100 nm and is in particular of gold or copper. This deposition takes place by radiofrequency cathodic sputtering.

This is followed by a second heat treatment at between 200° and 300+ C., which also brings about the local diffusion of gold or copper into the semiconductor layer 13 and consequently the formation of a P+- type overdoped region 31 just beneath each insulation trench to obtain zones 31 doped with $10^{18}$ to $10^{20}$ ions/cm$^2$ in place of $10^{16}$ ions/cm$^2$ for layer 13. Zones 31 can extend up to substrate 11.

In the possible case of a single heat treatment, this "second" treatment makes it possible to fix the P doping level and to regenerate the semiconductor zones disturbed during the working or machining of the trenches.

Figure 7:
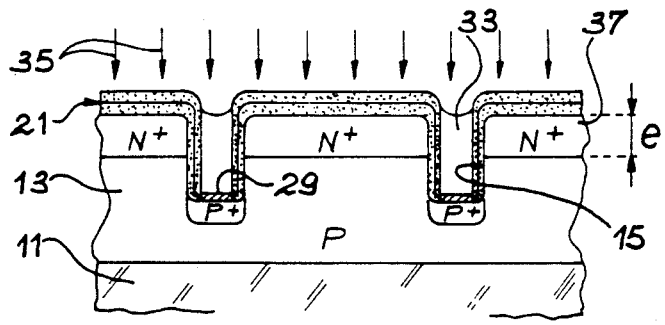

As shown in FIG. 6, this is followed by the deposition of a sufficiently viscous, thick resin 33, such as is conventionally used in photolithography (phenol-formaldehyde resin), whose thickness exceeds that of the depth of the trenches, in order to fill the latter and obtain a planar surface 33b. The spreading of the resin can be improved by carrying out a heat treatment at 150° C. for 15 minutes. This is followed either by a surface irradiation of all the resin 33 and development, or a direct etching of said resin by O$_2$ plasma, so as to only retain the resin within the trenches 15, as shown in FIG. 7. This resins protects the bottom of the trenches during the following stage.

This is followed by ion implantation 35, in order to obtain implanted zones 37 of the N or N+ type in the semiconductor layer 13, the remainder of the resin 33 serving as a mask for said implantation. This implantation takes place with boron ions at a dose of $10^{12}$ to $10^{15}$ ions/cm$^2$ and an energy of 50 to 200 keV. This gives 1 to 5 μm implanted zones 37 of thickness e, i.e. two to three times smaller than the depth h of trenches 15.

Figure 8:
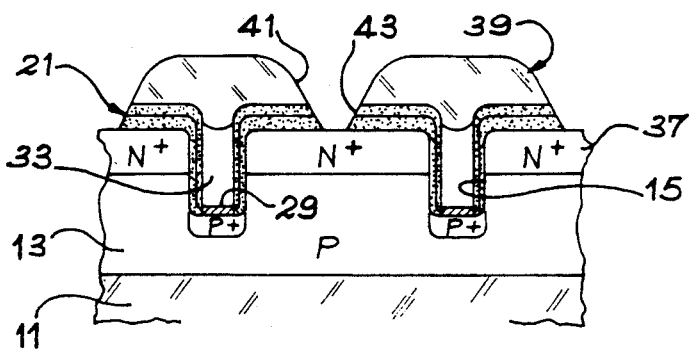

As shown in FIG. 8, the following stage of the process consists of producing a lithography mask 39 on the surface of the structure, whilst maintaining the rest of the resin 33 in the trenches 55. Mask 39 defines the location of the electrical contacts to be produced on the active zones 37, as well as the width and length of said electrical contacts. Mask 39 is produced by the deposition of a resin layer, like that conventionally used in microelectronics (AZ 1350 resin), which is then irradiated and developed in order to form an opening 41. A heat treatment of the structure obtained makes it possible to bring about a flow of resin 39 and to obtain an opening 41, whose sides are inclined with respect to the perpendicular at the surface of the structure by 30° to 40°. This is followed by ionic abrasion of the exposed regions of the insulating material 21, with a view to obtaining openings 43 having inclined sides in said material. Ionic abrasion takes place with an argon ion current of 500 nA/cm$^2$ and an energy of 500 eV.

The next stage of the process consists of eliminating the resin mask 39 and the remaining resin 33 using an oxygen plasma.

Figure 9:
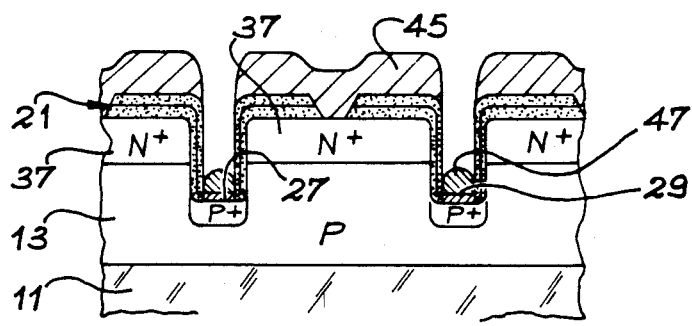

As shown in FIG. 9, deposition then takes place by Joule evaporation of the electrical contacts 45 and 47 respectively on the implanted regions 37 and the bottom 27 of the isolation trenches. These electrical contacts are in particular mode from a 1000 nm thick, two-layer chromium - gold material. This evaporation method makes it possible to obtain electrical contacts without clearing steps, because the latter have a high amplitude and are very narrow. This method also makes it possible to obtain contacts 47 which are all electrically interconnected.

Figure 10:
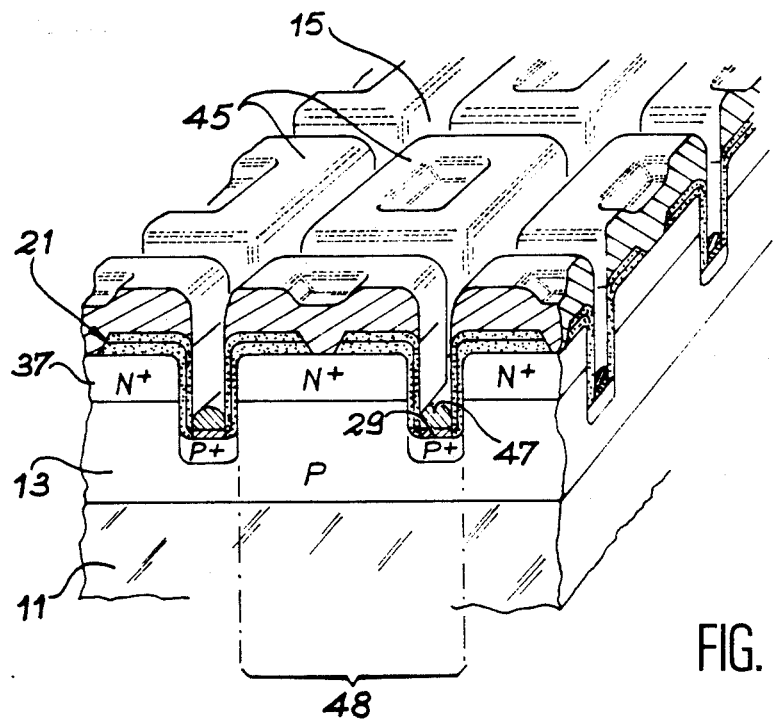
Figure 11:
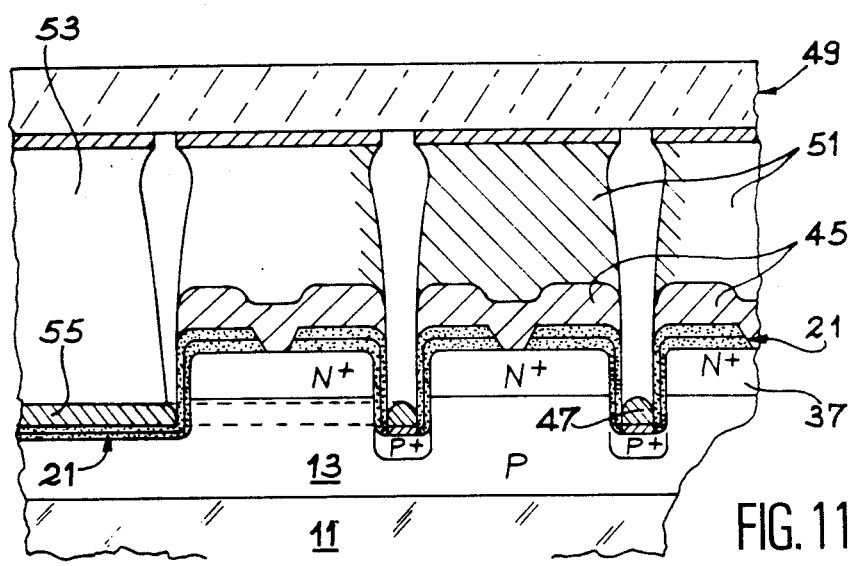

FIG. 10 shows the thus obtained array of photodiodes 48. The reading and addressing of the thus obtained photodiodes 48 separated by the trenches 15 are ensured by the integrated reading and addressing circuit, diagrammatically represented at 49 in FIG. 11. To this end, each contact 45 is connected to circuit 49 by an indium pad 51. Moreover, contacts 47 are connected to circuit 49 by at least one indium pad 53 as a result of a metallic contact 55 located on the periphery of the array and produced at the same time as contacts 47. The peripheral contact 55 is produced on a large region of the etched semiconductor layer 13 and is separated by the insulating material 21 in the embodiment described.

The above description has related to the production of photodiodes in a type P semiconductor layer. It is obviously possible to conceive photodiodes in a type N semiconductor layer and in this case the overdoped regions 31 are obtained by In-doped, liquid phase epitaxy, the active zones 37 by phosphorus implantation and the electrical contacts 45 and 47 are of aluminum.

We claim:

1. Photodiode (48) formed in a II-V material semiconductor layer (13) of a first conductivity type (P) directly deposited on an insulating substrate (11), having an active zone (37) of a second conductivity type (N) differing from the first, a first electrical contact (47) on the semiconductor layer, a second electrical contact (45) on the active zone, an insulant (21) separating the first and second electrical contacts, insulating trench (15) formed in the semiconductor layer and surrounding the active zone (37) having a depth at least two times higher than that thickness of the active zone, but less than the thickness of the semiconductor layer in order to reduce the dynamic resistance at zero polarization of the photodiode, and an overdoped zone (31) of the first conductivity type (p+) beneath the insulation trench (15), the first electrical contact (47) being located in the bottom (27) of the trench (15).

2. Photodiode according to claim 1, characterized in that a metallic layer (29) consisting of a meal of the first conductivity type (p+) is provided at the bottom (27) of trench (15), said metal being able to diffuse in the semiconductor layer.

3. Photodiode according to claim 1, characterized in that the depth of the trench is two to three times higher than the thickness of the active zone (37).

4. Photodiode according to claim 1, characterized in that the first conductivity type is of type P and the second conductivity type is of type N.

5. Photodiode according to claim 4, characterized in that the first electrical contact (47) is of gold copper of a two-layer chromium- gold material.

6. Photodiode according to claim 2, characterized in that the metallic layer (29) is of gold.

7. Photodiode according to claim 1, characterized in that the insulating substrate (11) is of CdTe and the semiconductor layer (13) of $H_{1-x}Cd_xTe$ with $0 \leq x \leq 1$.

8. Photodiode according to claim 1, characterized in that the depth of the trench (15) is greater than its width.

9. Array of photodiodes, characterized in that the photodiodes (48) are produced in accordance with claim 1 and in that the first electrical contacts (47) are all interconnected.

* * * * *

UNITED STATES PATENT AND TRADEMARK OFFICE
CERTIFICATE OF CORRECTION

PATENT NO. : 4,972,244

DATED : November 20, 1990

INVENTOR(S) : Buffet et al.

It is certified that error appears in the above-identified patent and that said Letters Patent is hereby corrected as shown below:

Column 1, line 50, delete "high" and insert --highly--.

line 68, delete "the" and insert --type--.

Column 2, line 18, delete "interfaces their" and insert --interfaces and their".

Column 3, line 32, delete "HgZCdTe" and insert --HgZnCdTe--.

line 42, delete "know" and insert --known--.

line 60, delete "te" and insert --the--.

line 61, delete "high" and insert --highly--.

Column 4, line 9, delete "contact" and insert --contacts--.

line 12, delete "current the" and insert --current and the--.

UNITED STATES PATENT AND TRADEMARK OFFICE
CERTIFICATE OF CORRECTION

PATENT NO. : 4,972,244

DATED : November 20, 1990

INVENTOR(S) : Buffet et al.

It is certified that error appears in the above-identified patent and that said Letters Patent is hereby corrected as shown below:

Column 6, line 8, delete "or the CdTe" and insert --or of CdTe--.

line 15, delete "takes a view" and insert --takes place with a view--.

Column 7, line 2, delete "300+" and insert --300°--.

line 5, after "insulation" delete "trench" and insert --trench 15. This procedure more particularly makes it possible--.

line 63, delete "mode" and insert --made--.

Column 8, Claim 2, line 42, delete "meal" and insert --metal--.

Claim 5, line 52, delete "gold copper of" and insert --gold, copper or--.

Signed and Sealed this

Seventh Day of April, 1992

Attest:

HARRY F. MANBECK, JR.

*Attesting Officer*  *Commissioner of Patents and Trademarks*